United States Patent [19]

Bluzer et al.

[11] Patent Number: 4,652,339

[45] Date of Patent: Mar. 24, 1987

[54] CCD GATE DEFINITION PROCESS

[75] Inventors: Nathan Bluzer, Silver Spring; James Halvis, Arnold, both of Md.

[73] Assignee: The United States of America as represented by the Secretary of the Air Force, Washington, D.C.

[21] Appl. No.: 831,908

[22] Filed: Feb. 24, 1986

[51] Int. Cl.[4] ..................... H01L 21/306; B44C 1/22; C03C 15/00; C03C 25/06
[52] U.S. Cl. ................................. 156/661.1; 29/571; 29/580; 29/578; 156/643; 156/648; 156/651; 156/653; 156/657; 156/662; 357/24; 357/59
[58] Field of Search ............... 156/643, 646, 648, 651, 156/653, 657, 659.1, 661.1, 662; 29/571, 580, 578; 357/24, 59, 65

[56] References Cited

U.S. PATENT DOCUMENTS

| | | | |
|---|---|---|---|
| 3,506,441 | 4/1970 | Gottfried | 96/36.2 |
| 3,823,015 | 7/1974 | Fassett | 96/36 |
| 4,053,349 | 10/1977 | Sinko | 156/628 |
| 4,061,530 | 12/1977 | Hosack | 156/653 |
| 4,063,992 | 12/1977 | Hosack | 156/662 X |
| 4,352,870 | 10/1982 | Howard et al. | 430/271 |

Primary Examiner—William A. Powell
Attorney, Agent, or Firm—William Stepanishen; Donald J. Singer

[57] ABSTRACT

A CCD gate definition process utilizing a thin film layer in a double masking process to form a first and second oxide layer over the polysilicon gate material to provide a profiled and tapered oxide layer over the gate without any re-entrant oxide steps.

3 Claims, 7 Drawing Figures

CCD GATE DEFINITION PROCESS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a process for defining semiconductor gates, and in particular to a CCD gate definition process.

In the prior art, the definition of lines with narrow spaces in between is a difficult process. Structures with narrow spaces in between lines occur in VHSIC and CCD type integrated circuits. In view of the great potential for process defects, the narrow spaces, in the order of 0.5 and 3μm, are not properly defined in any of the areas wherein the conductive material is not removed from the spaces. There are two reasons that are attributed for this defect which are reticle problems, and/or defects in the photoresist. The reticle problems which comprise elements such as dust and/or defects in the gap regions, can be eliminated by double-stepping or careful reticle inspection. However, the defects which exist in the photoresist, such as bridging or webbing in between lines requires a process that is tolerant to the photoresist limitations, and also one that eliminates electrical shorts between lines.

The definition of geometrical patterns with fine shapes and gaps in integrated circuits is limited by the defects in the defining layer, e.g., the photoresist or a thin film that is patterned with a photoresist layer. Typically, the defects in the photoresist are reproduced in the etched pattern. In a positive resist process, the defects consist of photoresist regions in which the photoresist does not normally develop when exposed to light. If these regions are located between the conductive lines, electrical shorts occur. Similarly if such defects occur in any contact window areas incomplete contact window openings will occur. While the number of photoresist defects is small, nevertheless in VLSI circuits, the probability is considerable that a defect will will occur within a circuit.

Since the number of photoresist defects is small, a process technique can be employed to completely circumvent the effects of photoresist defects. A double masking process is very effective in reducing the effects of resist defects. The reduction of detects occurs because the probability is very small that a photoresist defect will occur in a the same place for two sucessive masking operations.

The state of the art for processes which define semiconductor structure such as CCD gates is well represented and alleviated to some degree by the prior arts methods and techniques which are contained in the following U.S. Patents:

U.S. Pat. No. 3,506,441 issued to Gottfried on April 14, 1970;
U.S. Pat. No. 3,823,015 issued to Fassett on July 9, 1974;
U.S. Pat. No. 4,352,870 issued to Howard et al on October 5, 1982.

In the prior art, the process of CCD gate definition in order to prevent or eliminate shorts between the gates of a CCD was not addressed to any great extent. U.S. Pat. No. 4,352,870 discloses a high resolution two-layer resist composition with a sensitive and thicker resist at the lower layer allowing for the production of lines on the order of 400 Å (angstrom) in width separated by spaces on the order of 400 Å. The Gottfried reference, U.S. Pat. No. 3,506,441 discloses a double photoresist processing method for producing printed circuit substrates having closely spaced, fine line circuitry devoid of pinholes. Any imperfection formed during the application of an initial layer of photosensitive material upon a circuit substrate, which would result in a pinhole upon exposure of the substrate to an etchant, is corrected by the application of an additional layer of photoresist. The Fassett reference, U.S. Pat. No. 3,823,015 discloses a photo-masking process in which a method of pattern definition employing photoresist masking techniques useful in photoengraving generally and in semiconductor processing specifically wherein defects due to inherent mask flaws are minimized and mask tolerance is improved including the steps of thrice defining and etching a pattern definition layer using separate photo masks or, where possible, by indexing the same photo mask whereby flaws in the masks do not coincide. The present invention is intended to satisfy that need.

SUMMARY OF THE INVENTION

The present invention utilizes a double masking step in a CCD gate definition process to eliminate the re-entrant oxide by using a thin film layer other than photoresist to define the polysilicon gates used by defining the thin film layer with a double masking process before any of the polysilicon gate layer is etched.

It is one object of the present invention, therefore, to provide an improved process for CCD gate definition.

It is another object of the invention to provide an improved CCD gate definition process wherein a profiled oxide layer is produced over a polysilicon layer without re-entrant oxide regions.

It is another object of the invention to provide an improved CCD gate definition process wherein a thin film layer is utilized to define the polysilicon gate layers.

It is another object of the invention to provide an improved CCD gate definition process wherein the thin film layer is defined by a double masking process before any polysilicon layer is etched.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
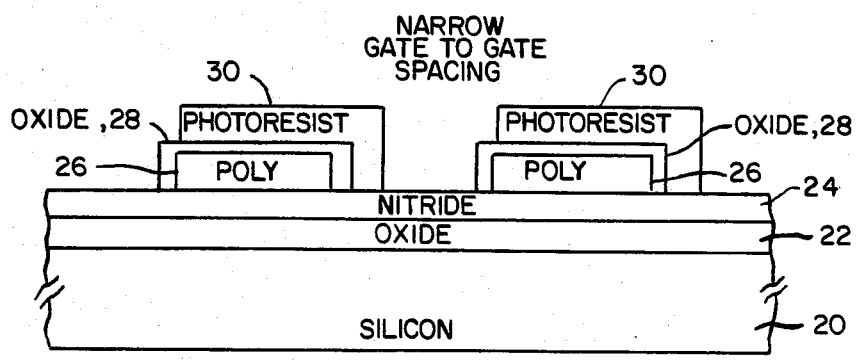
FIG. 1 is a section view of a semiconductor substrate before re-definition to eliminate electrical shorts.

Referring now to FIG. 1, there is shown a section view of a semiconductor substrate before redefinition to eliminate electrical shorts. The base substrate 20 which is silicon shown with a first (oxide 22) and a second (nitride 24) layer deposited thereon. The polysilicon gates 26 which are formed on the nitride layer 24 have an oxide layer 28 over them. The polysilicon gates 26 are arranged to provide narrow gate to gate spacing. The photoresist layers 30 which are redeposited for the process of re-defining the gates 26, are shown misaligned with the gates. In general, the double masking technique is utilized for defining CCD gates. When the oxidation of the polysilicon gates is completed, electrical tests are conducted on the substrates which contain the CCD gates to determine if any electrical shorts exist between the gates. If a substantial number of intra-electrode shorts are found, the polysilicon gates must be redefined for a second time using a second photoresist layer as shown in FIG. 1.

Before the polysilicon material 26 is re-etched the oxide layer 28 has to be re-etched in order to expose the polysilicon material 26 in the gap (the area between the polysilicon materials 26) regions. Any misalignment between the photoresist layer 30 and the polysilicon gates 26 will produce a polysilicon undercut area after the chemical etch process is completed. This undercut area 40 is shown FIG. 2 and represents the area in the polysilicon layer in which the photoresist layer was misaligned. When the oxide layer is re-applied during the gate definition process, the dashed areas, also known as the undercut area 40, comprises a re-oxidized polysilicon region. If, during these steps of the process, plasma etching is used, the gate nitride layer 22 will also be attacked. Thus, it may be seen that the spacing between the gates will increase and widen, and that the gate widths will decrease and become narrower with the second etch operation.

Figure 2:
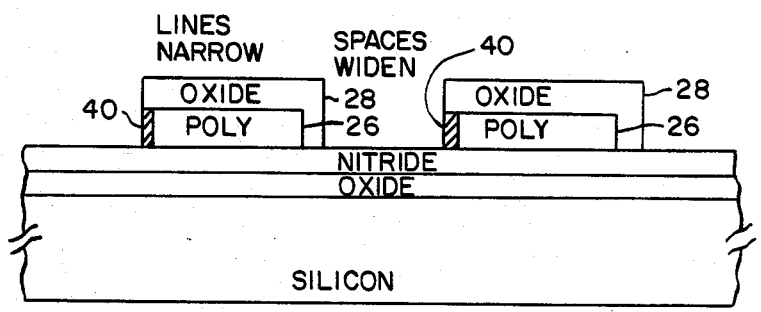
FIG. 2 is a section view illustrating the effects of etching oxidized polysilicon with a mis-aligned photoresist layer.
Figure 3:
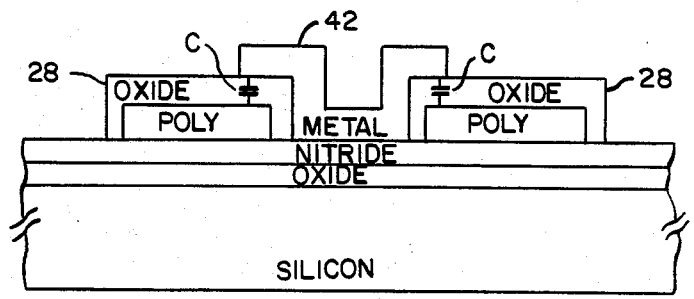
FIG. 3 is a section view illustrating the reduction in the inter-electrode capacitance, C, by shaping the oxide over the polysilicon gates.

The problem which is illustrated in FIG. 2 is aggravated if a tapered oxide layer is deposited over the polysilicon gates in an attempt to reduce the inter-electrode capacitance, C. This arrangement is shown in FIG. 3 wherein the oxide layer 28 is tapered. The inter-electrode capacitance, C is formed between the oxide layer 28 and the metal layer 42.

Figure 4:
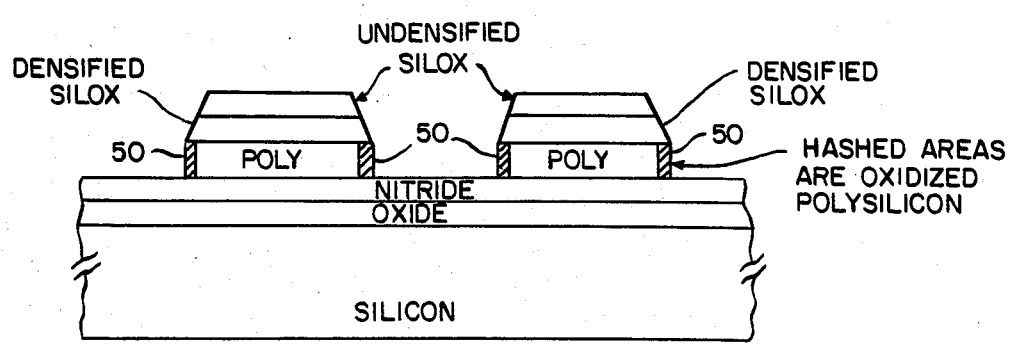
FIG. 4 is a section view illustrating a profiled oxide over a polysilicon gate.
Figure 5:
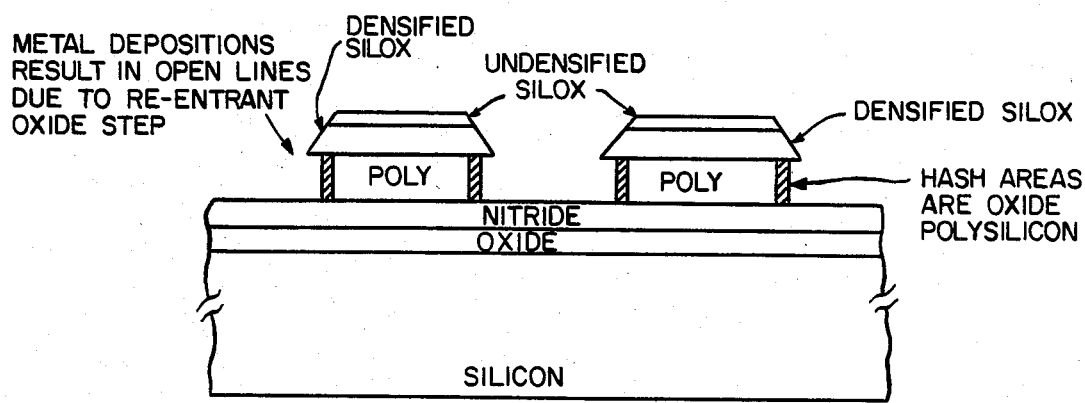
FIG. 5 is a section view illustrating the gate structure after double masking.

A process for fabricating the tapered oxide over the polysilicon gates is shown in FIG. 4. It may be seen that this process results in the hashed areas 50 which represent oxidized polysilicon. If intra-electrode shorts are detected on the substrate, a double masking process is used. However, the double masking process will result in a severe re-entrant oxide profile which is shown in FIG. 5. The double masking process is subject to defects that lead to open metal lines. This is in fact due to the metal deposition step in the double masking which results in the open lines that is caused by the re-entrant oxide step.

Figure 6:
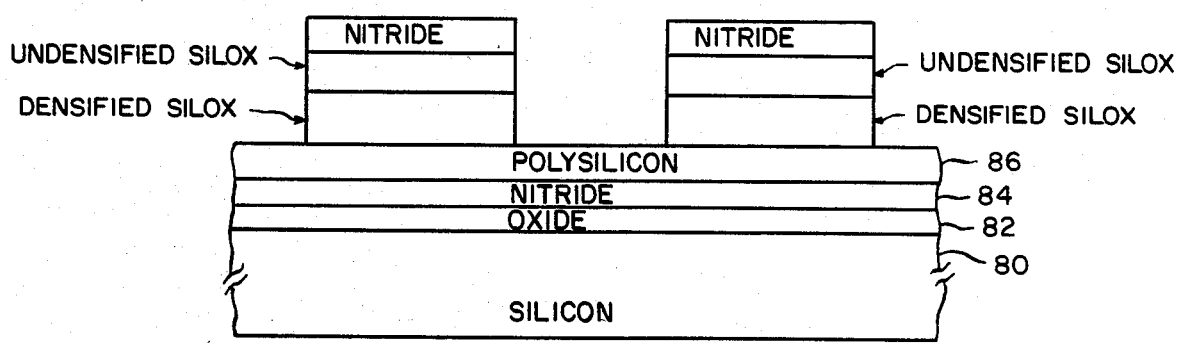
FIG. 6 is a section view illustrating the process for producing a profiled oxide over polysilicon without re-entrant oxide regions, and, FIG. 7 is a section view illustrating the profiled and tapered oxide layer over the polysilicon layer according to the process of the present invention.

Turning now to FIG. 6, there is shown a section view illustrating the process for producing a profiled oxide over the polysilicon layer without creating re-entrant oxide regions. The base silicon substrate 80 has deposited thereon an oxide layer 82, a nitride alyer 84 and a polysilicon layer 86. The process to eliminate the re-entrant oxide step is possible with a different process.

The new technique is based on the following two premises: (a) using a thin film other than photoresist for defining the polysilicon gates; (b) defining the thin film with a double masking process before any of the polysilicon layer is etched.

Figure 7:
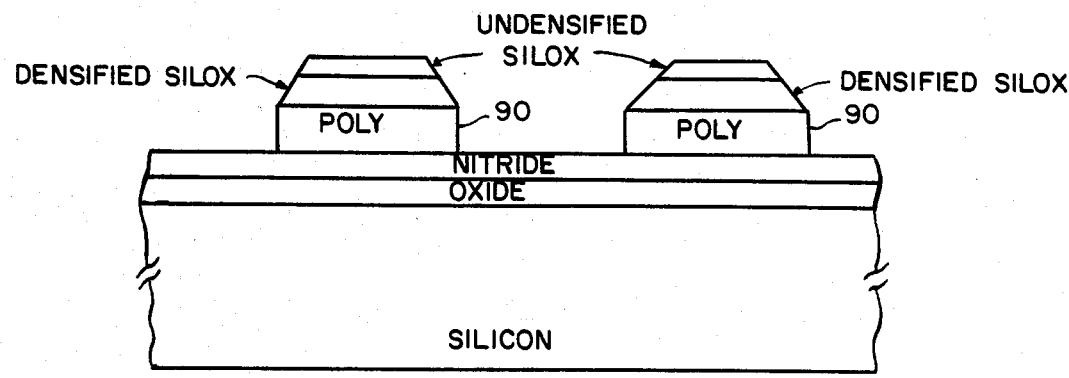

In FIG. 6 a masking layer which consists of a nitride layer is defined and etched by a double masking step. After the nitride layer is etched the second time and the resist stripped, the oxide layer is etched in a plasma. Next, 80% of the exposed polysilicon layer 86 is etched by using the upper layers for a mask. Before the remaining 20% of polysilicon layer 86 is etched, the layers over the polysilicon which comprise the undensified and densified silox layers, oxide will be etched. An undercut of the silox layers will occur because the etch rate of undensified oxide is faster than the etch rate of densified silox. Following the silox layer etch, the remaining nitride layer which remains over the silox layer, is removed. Finally, the remaining 20% of the polysilicon layer 86 is etched by using the remaining silox layers as an etch mask. In FIG. 7 there is shown the result of the etching process wherein a profiled and tapered oxide layer is formed over the polysilicon gates 90 without any re-entrant oxide steps. In conclusion, the process herein described will eliminate the electrical shorts which typically occur between the conductive lines and while it will maintain good step coverage over the polysilicon gates.

Although the invention has been described with reference to a particular embodiment, it will be understood to those skilled in the art that the invention is capable of a variety of alternative embodiments within the spirit and scope of the appended claims.

What is claimed is:

1. The method of defining CCD gates on a substrate comprising the steps of:
   (a) forming a base substrate of silicon material;
   (b) providing an oxide layer on said base substate of silicon material;
   (c) depositing a nitride layer on said oxide layer;
   (d) depositing a polysilicon layer on said nitride layer;
   (e) defining the CCD gate regions by using a predetermined thin film layer;
   (f) defining said thin film layer with a double masking process before any of said polysilicon layer is etched, said double masking process providing a first and second oxide layer over said polysilicon layer;
   (g) etching 80% of said polysilicon layer using said thin film layer and said first and second oxide layers as a mask;
   (h) etching said first and second oxide layers before the remaining 20% of said polysilicon layer is etched, to provide an undercut in said first and second oxide layers;
   (i) removing said thin film from said first and second oxide layers;
   (j) etching the remaining 20% of said polysilicon layer using the remaining layers of said first and second oxide layers as a mask, and,
   (k) oxidizing the gate structure to provide a tapered and profiled oxide layer after the polysilicon without any re-entrant oxide steps.

2. The method of claim 1 wherein said thin film layer comprises a nitride layer.

3. The method of claim 1 wherein said first oxide layer comprises densified silox and said second oxide layer comprises undensified silox.

* * * * *